United States Patent
Kim et al.

(10) Patent No.: US 10,672,764 B2
(45) Date of Patent: Jun. 2, 2020

(54) INTEGRATED CIRCUIT SEMICONDUCTOR DEVICES INCLUDING A METAL OXIDE SEMICONDUCTOR (MOS) TRANSISTOR

(71) Applicant: Samsung Electronics Co., Ltd., Suwon-si, Gyeonggi-do (KR)

(72) Inventors: Seok-hoon Kim, Suwon-si (KR); Dong-myoung Kim, Suwon-si (KR); Jin-bum Kim, Seoul (KR); Seung-hun Lee, Hwaseong-si (KR); Cho-eun Lee, Pocheon-si (KR); Hyun-jung Lee, Suwon-si (KR); Sung-uk Jang, Hwaseong-si (KR); Edward Namkyu Cho, Seongnam-si (KR); Min-hee Choi, Suwon-si (KR)

(73) Assignee: Samsung Electroncis Co., Ltd. (KR)

(*) Notice: Subject to any disclaimer, the term of this patent is extended or adjusted under 35 U.S.C. 154(b) by 0 days.

(21) Appl. No.: 16/174,894

(22) Filed: Oct. 30, 2018

(65) Prior Publication Data
US 2019/0252376 A1 Aug. 15, 2019

(30) Foreign Application Priority Data
Feb. 9, 2018 (KR) .................. 10-2018-0016570

(51) Int. Cl.
| H01L 27/085 | (2006.01) |
| H01L 29/06 | (2006.01) |
| H01L 29/423 | (2006.01) |
| H01L 27/088 | (2006.01) |
| H01L 21/8234 | (2006.01) |

(52) U.S. Cl.
CPC .... *H01L 27/085* (2013.01); *H01L 21/823418* (2013.01); *H01L 21/823431* (2013.01);
(Continued)

(58) Field of Classification Search
CPC ....... H01L 21/82341; H01L 21/823821; H01L 21/823885; H01L 29/785; H01L 29/78642;
(Continued)

(56) References Cited

U.S. PATENT DOCUMENTS 9,673,295 B2 6/2017 Levesque
10,121,791 B2 * 11/2018 Yu .................... H01L 29/0886
(Continued)

FOREIGN PATENT DOCUMENTS

KR 100806038 2/2008
KR 1020150146372 12/2015
(Continued)

*Primary Examiner* — Hsien Ming Lee
(74) *Attorney, Agent, or Firm* — Myers Bigel, P.A.

(57) ABSTRACT

A semiconductor device includes a first region having a first active pattern with first protrusion portions and first recess portions, and a second region having a second active pattern with second protrusion portions and second recess portions. First gate patterns are on the first protrusion portions. Second gate patterns are on the second protrusion portions. A first source/drain region is on one of the first recess portion of the first active pattern between two of the first gate patterns. The first source/drain region has a first reinforcing epitaxial layer at an upper portion thereof. A second source/drain region is on one of the second recess portions of the second active pattern between two of the second gate patterns. The second source/drain region has a second reinforcing epitaxial layer having an epitaxial growth surface that is shaped differently than a first epitaxial growth surface of the first reinforcing epitaxial layer.

20 Claims, 14 Drawing Sheets

(52) U.S. Cl.
CPC ...... *H01L 27/0886* (2013.01); *H01L 29/0638* (2013.01); *H01L 29/42356* (2013.01)

(58) Field of Classification Search
CPC ........... H01L 29/7926; H01L 29/66666; H01L 29/66909; H01L 29/7828; H01L 29/7788; H01L 29/7827; H01L 27/0886; H01L 27/0924
See application file for complete search history.

(56) References Cited

U.S. PATENT DOCUMENTS

| | | |
|---|---|---|
| 2008/0124876 A1 | 5/2008 | Ryu |
| 2014/0117456 A1 | 5/2014 | Huang |
| 2015/0255543 A1* | 9/2015 | Cheng ................. H01L 29/7848 257/288 |
| 2015/0372142 A1 | 12/2015 | Kuang |
| 2016/0020301 A1 | 1/2016 | Park |
| 2016/0056238 A1 | 2/2016 | Lim |
| 2016/0276481 A1 | 9/2016 | Wu |
| 2016/0293702 A1 | 10/2016 | Chen |
| 2018/0040621 A1* | 2/2018 | Liaw ................. H01L 29/66545 |

FOREIGN PATENT DOCUMENTS

| | | |
|---|---|---|
| KR | 1015915640000 | 1/2016 |
| KR | 1020160011301 | 2/2016 |
| KR | 1017294170000 | 4/2017 |
| KR | 1017346650000 | 5/2017 |

\* cited by examiner

INTEGRATED CIRCUIT SEMICONDUCTOR DEVICES INCLUDING A METAL OXIDE SEMICONDUCTOR (MOS) TRANSISTOR

This application claims priority under 35 U.S.C. § 119 to Korean Patent Application No. 10-2018-0016570, filed on Feb. 9, 2018, in the Korean Intellectual Property Office, the disclosure of which is incorporated herein in its entirety by reference.

BACKGROUND

The present inventive concepts relate to integrated circuit semiconductor devices, and more particularly, to integrated circuit semiconductor devices including a metal oxide semiconductor (MOS) transistor.

As the electronics industry develops, an increased reliability of integrated circuit semiconductor device including a plurality of MOS transistors is desired. For example, each of the MOS transistors included in the integrated circuit semiconductor device may be required to have high performance and consistent performance between the MOS transistors.

SUMMARY

The present inventive concepts provide integrated circuit semiconductor devices including a metal oxide semiconductor (MOS) transistor having high reliability.

According to an aspect of the present inventive concepts, there is provided an integrated circuit semiconductor device including a first region extending in a first direction and having a first active pattern with first protrusion portions and first recess portions, a second region extending in the first direction and having a second active pattern with second protrusion portions and second recess portions, first gate patterns extending in a second direction crossing the first direction in the first region, where the first gate patterns are on respective ones of the first protrusion portions and are spaced apart from each other, and second gate patterns extending in the second direction in the second region, where the second gate patterns are on the second protrusion portions and are spaced apart from each other. The integrated circuit semiconductor device may include a first source/drain region on a first recess portion of the first recess portions of the first active pattern, where the first source/drain region is between two of the first gate patterns in the first region and has a first reinforcing epitaxial layer at an upper portion of the first source/drain region. A second source/drain region is on a second recess portion of the second recess portions of the second active pattern. The second source/drain region is between two of the second gate patterns in the second region and has a second reinforcing epitaxial layer having a second epitaxial growth surface that is shaped differently than a first epitaxial growth surface of the first reinforcing epitaxial layer.

According to an aspect of the present inventive concepts, there is provided an integrated circuit semiconductor device including a substrate including a first active pattern extending in a first direction and having first protrusion portions and first recess portions of a first depth, and a second active pattern extending in the first direction and having second protrusion portions and second recess portions of a second depth, where the second depth is greater than the first depth, first gate patterns extending in a second direction crossing the first direction and on respective ones of the first protrusion portions, where the first gate patterns are spaced apart from each other by a first distance, second gate patterns extending in the second direction and on respective ones of the second protrusion portions, where the second gate patterns are spaced from each other by a second distance equal to the first distance, a first source/drain region on a first recess portion of the first recess portions of the first active pattern between two of the first gate patterns, where the first source/drain region includes a first reinforcing epitaxial layer at an upper portion thereof, and a second source/drain region on a second recess portion of the second recess portions of the second active pattern between two of the second gate patterns, where the second source/drain region includes a second reinforcing epitaxial layer at the upper portion thereof.

According to an aspect of the present inventive concepts, there is provided an integrated circuit semiconductor device including a substrate including a first active pattern extending in a first direction and having first protrusion portions and first recess portions, and a second active pattern extending in the first direction and having second protrusion portions and second recess portions, first gate patterns extending in a second direction crossing the first direction and on respective ones of the first protrusion portions, where the first gate patterns are spaced apart from each other by a first distance, second gate patterns extending in the second direction and on respective ones of the second protrusion portions, where the second gate patterns are spaced apart from each other by a second distance greater than the first distance, a first source/drain region on a first recess portion of the first recess portions of the first active pattern between two of the first gate patterns, where the first source/drain region includes a first reinforcing epitaxial layer at an upper portion thereof, and a second source/drain region on a second recess portion of the second recess portions of the second active pattern between two of the second gate patterns, where the second source/drain region includes a second reinforcing epitaxial layer at an upper portion thereof.

BRIEF DESCRIPTION OF THE DRAWINGS

Embodiments of the present inventive concepts will be more clearly understood from the following detailed description taken in conjunction with the accompanying drawings in which.

DETAILED DESCRIPTION

Hereinafter, embodiments of the present inventive concepts will be described in detail with reference to the accompanying drawings. The following embodiments of the present inventive concepts may be implemented by any one of them, and the following embodiments may be implemented by combining one or more of them. Therefore, the present inventive concepts are not limited to only one embodiment.

Figure 1:
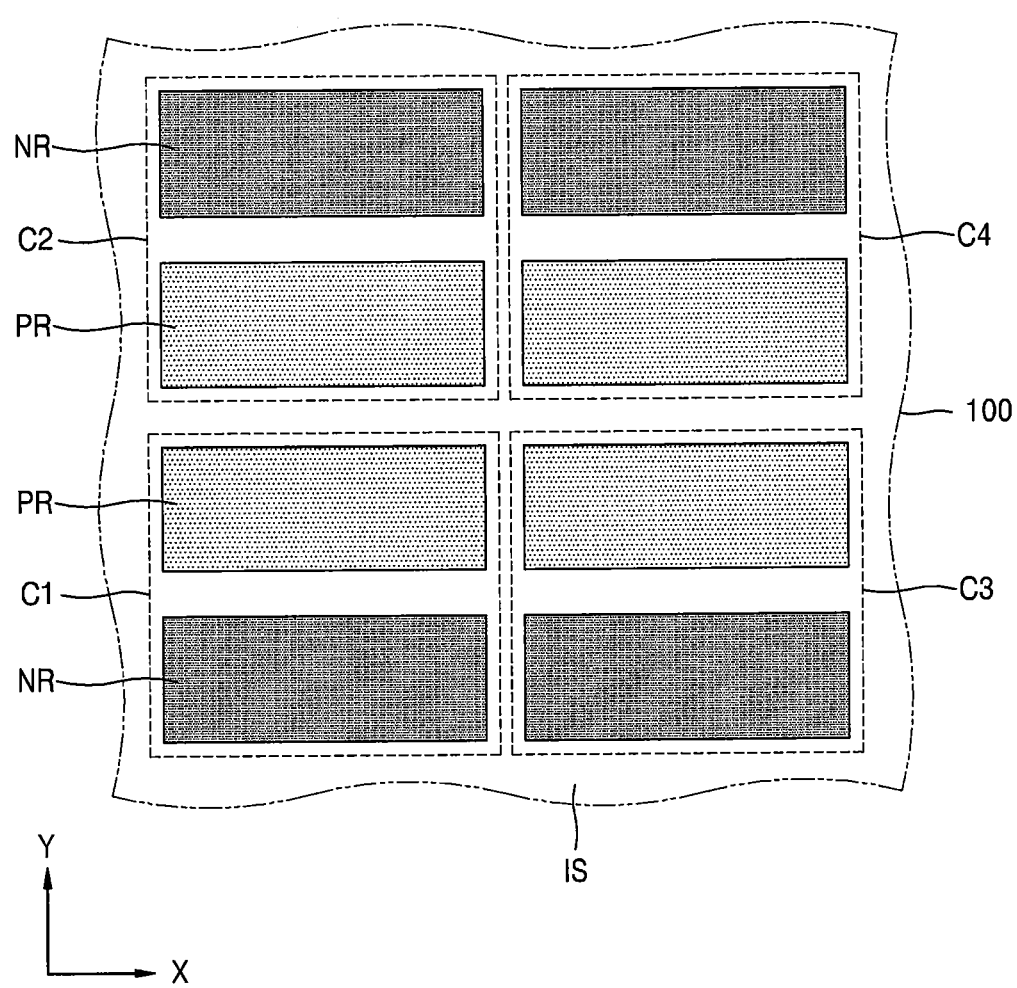
FIG. 1 is a layout diagram of an integrated circuit semiconductor device according to an embodiment of the present inventive concepts.

FIG. 1 is a layout diagram of an integrated circuit semiconductor device 200 according to an embodiment of the present inventive concepts.

Specifically, an integrated circuit semiconductor device 200 of the present inventive concepts may include logic cells C1, C2, C3, and C4 provided on a substrate 100. Each of the logic cells C1, C2, C3, and C4 may include MOS transistors. The integrated circuit semiconductor device 200 may include a first logic cell C1, a third logic cell C3 spaced apart from the first logic cell C1 in a first direction (X direction), a second logic cell C2 spaced from the first logic cell C1 in a second direction (Y direction), and a fourth logic cell C4 spaced apart from the second logic cell C2 in the first direction (X direction).

Each of the logic cells C1, C2, C3, and C4 may include an active region and/or an active pattern separated by an isolation layer IS. Each of the logic cells C1, C2, C3, and C4 may include a PMOS transistor region PR and an NMOS transistor region NR separated by the isolation layer IS. The PMOS transistor region PR and the NMOS transistor region NR may be a PMOS field effect transistor (PMOSFET) region and an NMOS field effect transistor (NMOSFET) region, respectively.

In an embodiment, PMOS transistor regions PR and NMOS transistor regions NR may be spaced apart in a second direction (e.g., a Y direction). The PMOS transistor region PR of the first logic cell C1 may be adjacent to the PMOS transistor region PR of the second logic cell C2 in the second direction (e.g., the Y direction). Hereinafter, a logic cell may refer to a unit for performing at least one logic operation. The number of logic cells is illustrated to be four, but the present inventive concepts are not limited thereto.

Figure 2:
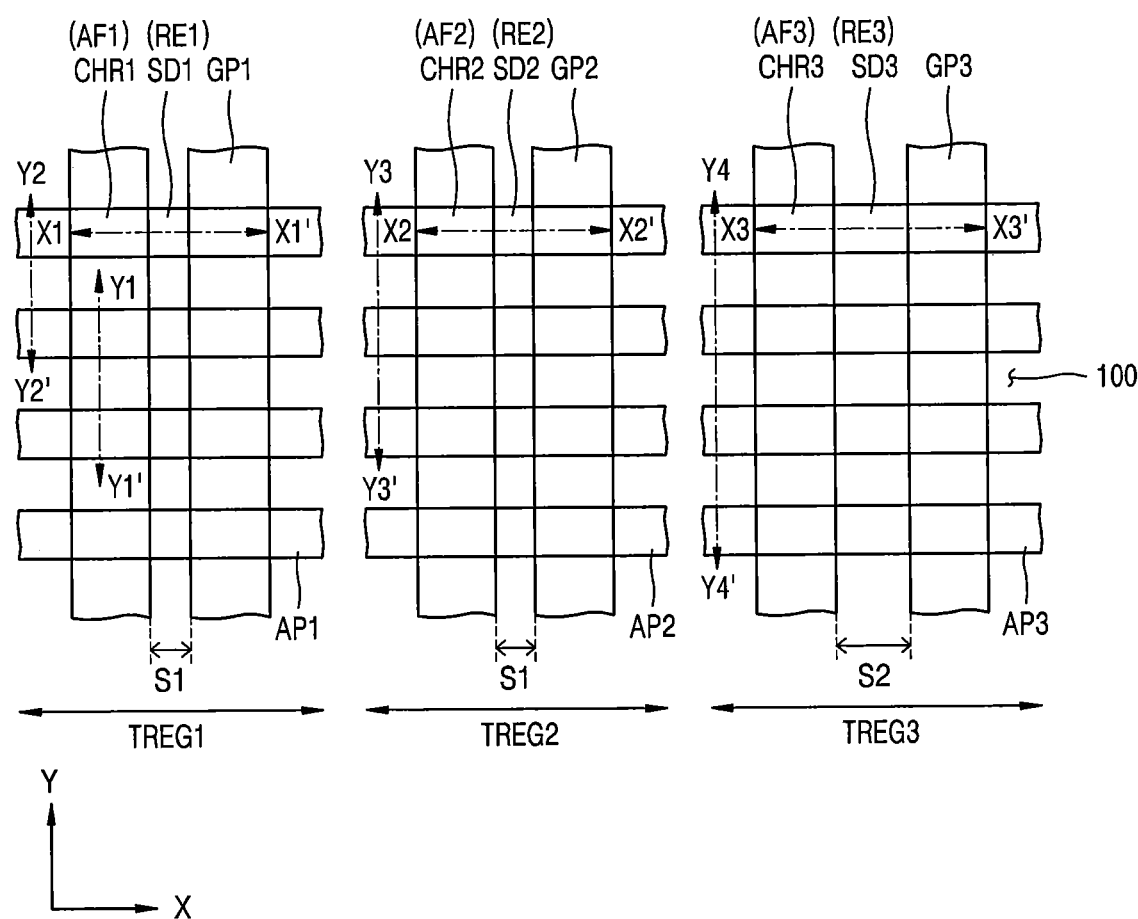
FIG. 2 is a layout diagram of an integrated circuit semiconductor device according to an embodiment of the present inventive concepts.

FIG. 2 is a layout diagram of an integrated circuit semiconductor device 200 according to an embodiment of the present inventive concepts.

Specifically, the integrated circuit semiconductor device 200 of FIG. 2 may be a layout of any one of the first logic cell C1 to the fourth logic cell C4 of FIG. 1. The integrated circuit semiconductor device 200 may include a first MOS transistor region TREG1, a second MOS transistor region TREG2, and a third MOS transistor region TREG3 disposed on the substrate 100.

The first MOS transistor region TREG1, the second MOS transistor region TREG2, and the third MOS transistor region TREG3 may be referred to as a first region, a second region, and a third region, respectively.

The first MOS transistor region TREG1, the second MOS transistor region TREG2, and the third MOS transistor region TREG3 may include the PMOS transistor region PR and the NMOS transistor region NR described with respect to FIG. 1. The first MOS transistor region TREG1, the second MOS transistor region TREG2, and the third MOS transistor region TREG3 are illustrated separately for convenience of explanation.

The first MOS transistor region TREG1 may include a first active pattern AP1 extending in a first direction (e.g., an X direction). The first active pattern AP1 may include a first protrusion portion AF1 and a first recess portion RE1 adjacent one another in the first direction. First protrusion portions AF1 and first recess portions RE1 may be sequentially and repeatedly formed in the first direction. A plurality of the first active patterns AP1 may be formed to be separated from each other in a second direction (e.g., the Y direction) perpendicular to and/or crossing the first direction.

The first MOS transistor region TREG1 may extend in the second direction (e.g., the Y direction), and a first gate pattern GP1 may be formed to be on and, in some embodiments, to surround the first protrusion portions AF1 of the first active patterns AP1. A plurality of first gate patterns GP1 may be arranged in the first direction and be spaced apart from each other by a first distance S1 in the first direction. A first channel region CHR1 of the first MOS transistor may be formed in the first protrusion portion AF1.

The first source and/or drain region SD1 (referred to herein as a source/drain region) of the first MOS transistor may be formed in the first recess portion RE1. In some embodiments, the first source and/or drain region SD1 may be configured to serve as a source or drain of the first MOS transistor. The first source/drain regions SD1 may be formed with a first reinforcing epitaxial layer (SD1r in FIG. 3B and FIG. 4A) at an upper portion thereof. A vertical structure of the first protrusion portion AF1, the first recess portion RE1, the first gate pattern GP1, and the first source/drain regions SD1 will be described in detail with reference to FIGS. 3A, 3B, and 4A.

The second MOS transistor region TREG2 may be the same or similar as the first MOS transistor region TREG1 except that a depth of a second recess portion RE2 may be formed deeper than a depth of the first recess portion RE1. The depth of the second recess portion RE2 of the second MOS transistor region TREG2 will be described in more detail with reference to FIGS. 3C and 4B.

The second MOS transistor region TREG2 may include a second active pattern AP2 extending in the first direction (e.g., the X direction). The second active pattern AP2 may include a second protrusion portion AF2 and a second recess portion RE2 arranged in the first direction. Second protrusion portions AF2 and second recess portions RE2 may be sequentially and repeatedly formed in the first direction. The second active patterns AP2 may be formed to be separated from each other in the second direction (e.g., the Y direction) perpendicular to and/or crossing the first direction.

The second MOS transistor region TREG2 may extend in the second direction (e.g., the Y direction) and a second gate pattern GP2 may be formed to be on and, in some embodiments, to surround a second protrusion portion AF2 of the second active pattern AP2. A plurality of second gate patterns GP2 may be spaced apart from each other by the first distance S1 in the first direction. A second channel region CHR2 of the second MOS transistor may be formed in the second protrusion portion AF2.

Second source/drain regions SD2 of the second MOS transistor may be formed in the second recess portion RE2. The second source/drain regions SD2 may be formed with a second reinforcing epitaxial layer (SD2r in FIG. 3C and FIG. 4B) at an upper portion thereof. A vertical structure of the second protrusion portion AF2, the second recess portion RE2, the second gate pattern GP2, and the second source/drain region SD2 will be described in more detail with reference to FIGS. 3C and 4B.

The third MOS transistor region TREG3 may include a third active pattern AP3 extending in a first direction (e.g., the X direction). The third active pattern AP3 may include a third protrusion portion AF3 and a third recess portion RE3 arranged in the first direction. A plurality of third active patterns AP3 may be formed to be separated from each other in the second direction (e.g., the Y direction) perpendicular to and/or crossing the first direction.

The third MOS transistor region TREG3 may extend in the second direction (e.g., the Y direction) and may have a third gate pattern GP3 that is formed to be on and, in some embodiments, to surround the third protrusion portion AF3 of the third active pattern AP3. The third gate patterns GP3 may be formed in a plurality of locations spaced apart from each other by a second distance S2 greater than the first distance S1 in the first direction. A third channel region CHR3 of the third MOS transistor may be formed in the third protrusion portion AF3.

The third MOS transistor region TREG3 may be formed such that the depth of the third recess portion RE3 is deeper than the depth of the first recess portion RE1 and the depth of the second recess portion RE2. The second distance S2 separating third gate patterns GP3 of the third MOS transistor region TREG3 may be greater than the first distance S1 of the first gate patterns GP1 and the second gate patterns GP2. The depth of the third recess portion RE3 of the third MOS transistor region TREG3 and the second distance S2 of the third gate patterns GPE will be described in more detail with reference to FIGS. 3D and 4C.

Third source/drain regions SD3 of the third MOS transistor may be formed in the third recess portion RE3. The third source/drain regions SD3 may be formed, at an upper portion thereof, with a third reinforcing epitaxial layer (SD3$r$ in FIGS. 3D and 4C) having an upper epitaxial growth surface that is different than those of the first reinforcing epitaxial layer (SD1$r$ in FIGS. 3B and 4A) and the second reinforcing epitaxial layer (SD2$r$ in FIGS. 3C and 4B). A vertical structure of the third protrusion portion AF3, the third recess portion RE3, the third gate pattern GP3, and the third source/drain regions SD3 will be described in more detail with reference to FIG. 3D and FIG. 4C.

Figure 3A:
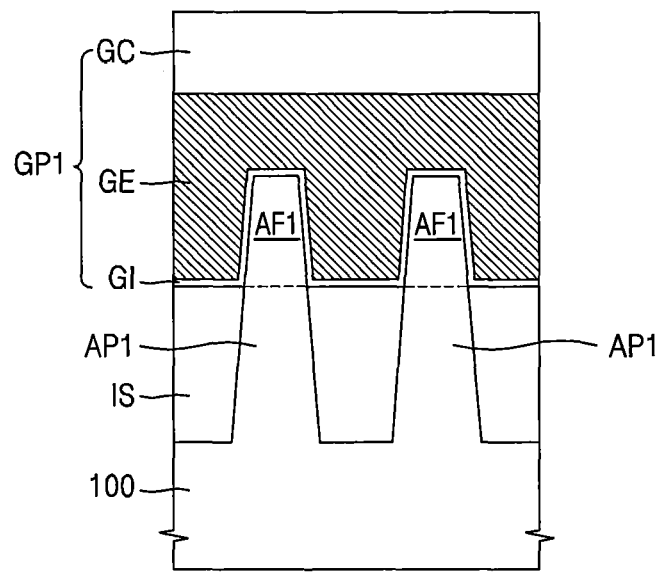
FIG. 3A is a cross-sectional view taken along a line Y1-Y1' of FIG. 2.
Figure 3B:
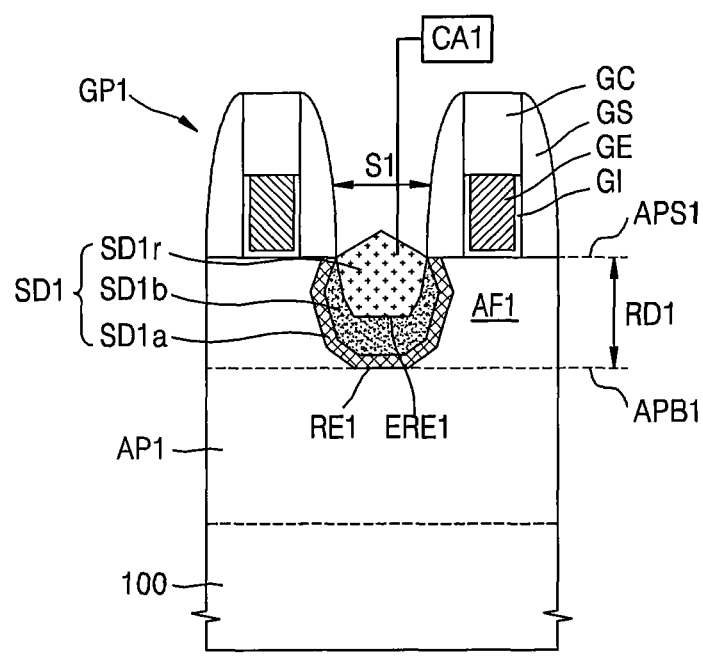
FIG. 3B is a cross-sectional view taken along a line X1-X1' of FIG. 2.
Figure 3C:
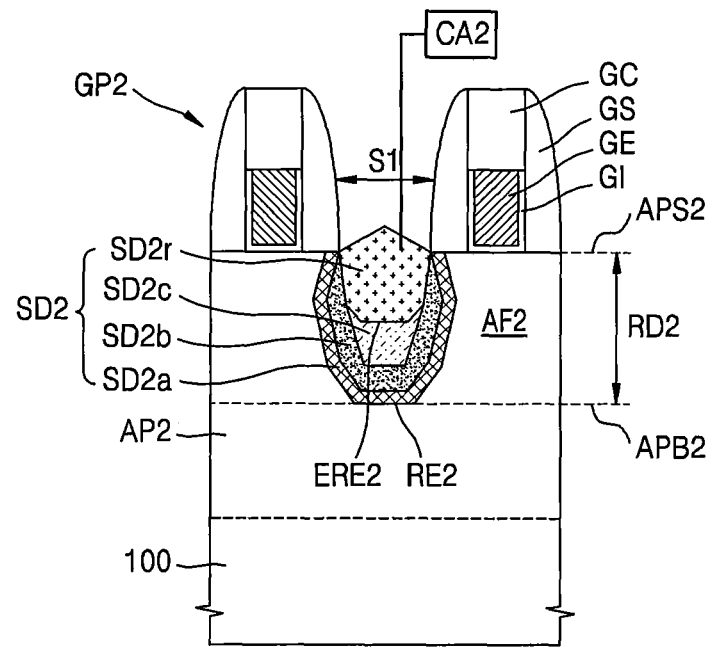
FIG. 3C is a cross-sectional view taken along a line X2-X2' of FIG. 2.
Figure 3D:
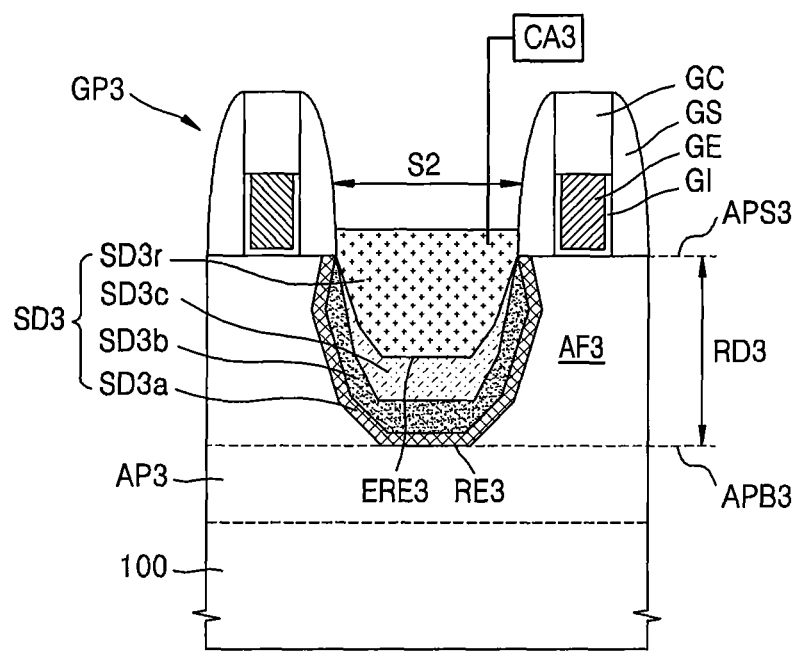
FIG. 3D is a cross-sectional view taken along a line X3-X3' of FIG. 2.

FIG. 3A is a cross-sectional view taken along a line Y1-Y1' of FIG. 2, FIG. 3B is a cross-sectional view taken along a line X1-X1' of FIG. 2, FIG. 3C is a cross-sectional view taken along a line X2-X2' of FIG. 2, and FIG. 3D is a cross-sectional view taken along a line X3-X3' of FIG. 2.

FIGS. 3A and 3B are cross-sectional views of a first MOS transistor region TREG1 taken along lines Y1-Y1' and X1-X1' of FIG. 2, respectively. Referring to FIGS. 3A and 3B, the substrate 100 may include a first active pattern AP1 including a first protrusion portion AF1 and a first recess portion RE1. The first active pattern AP1 may be defined by a device isolation layer IS, as illustrated in FIG. 3A. The first protrusion portion AF1 may be a portion protruding from an upper surface of the substrate 100, as illustrated in FIG. 3A. The first protrusion portion AF1 may be a fin type active pattern formed on an upper portion of the first active pattern AP1. The first gate pattern GP1 may be formed on and, in some embodiments, surrounding the first protrusion portion AF1 of the first active pattern AP1. The first gate pattern GP1 may include a gate insulating layer GI, a gate electrode GE, a gate cap layer GC, and a gate spacer GS. The first gate patterns GP1 may be spaced apart from each other by the first distance S1. In some embodiments, the first distance S1 may be a distance between closest portions of adjacent ones of the first gate patterns GP1.

The first gate pattern GP1 may be formed on the first protrusion portion AF1, as illustrated in FIG. 3B. The first recess portion RE1 may be formed in a portion recessed to a first depth RD1 from a first upper surface APS1 of the first protrusion portion AF1 to a first bottom surface APB1, as illustrated in FIG. 3B. The first source/drain region SD1 may be formed over the first recess portion RE1. The first source/drain region SD1 may include a plurality of first base epitaxial layers SD1$a$ and SD1$b$ having different impurity concentrations. In FIG. 3B, two first base epitaxial layers (SD1$a$, SD1$b$) are illustrated, but this is illustrated for convenience and the present inventive concepts are not limited thereto.

The first source/drain regions SD1 may be formed with a first reinforcing epitaxial layer SD1$r$ on the first base epitaxial layers SD1$a$ and SD1$b$. The first reinforcing epitaxial layer SD1$r$ may be formed on a first epitaxial recess portion ERE1 formed by recessing an upper surface of the first base epitaxial layers SD1$a$ and/or SD1$b$.

The first reinforcing epitaxial layer SD1$r$ may be formed to have an upper surface higher than the first upper surface APS1 of the first protrusion portion AF1 of the first active pattern AP1 between the first gate patterns GP1. The uppermost surface of the first reinforcing epitaxial layer SD may be positioned higher than the lower surface of the first gate patterns GP1. The lowermost surface of the first reinforcing epitaxial layer SD1$r$ may be positioned lower than the first upper surface APS1 of the first protrusion portion AF1 of the first active pattern AP1. A first contact portion CA1 may be connected to the first reinforcing epitaxial layer SD1$r$ of the first source/drain regions SD1.

In some embodiments, an upper shape of the first reinforcing epitaxial layer SD1$r$ may have a peaked shape. For example, in some embodiments, an upper shape of the first reinforcing epitaxial layer SD1$r$ may be formed in a cone shape. That is, the upper epitaxial growth surface of the first reinforcing epitaxial layer SD1$r$ may be formed in a cone shape. The first contact portion CA1 on the first source/drain region SD1 may be reliably formed by the widening of a surface area of the first source/drain region SD1 due to the formation of the cone-shaped first reinforcing epitaxial layer SD1$r$.

The first base epitaxial layers SD1$a$ and SD1$b$ and the first reinforcing epitaxial layer SD1$r$ may be formed by an epitaxial growth method. The first base epitaxial layers SD1$a$ and SD1$b$ and the first reinforcing epitaxial layer SD1$r$ may include, for example, a silicon layer (Si), a germanium layer (Ge), a silicon germanium layer (SiGe), a silicon boron layer (SiB), a silicon phosphorus layer (SiP), a silicon carbon phosphorous layer (SiCP), and/or a combination thereof.

FIG. 3C is a cross-sectional view of the second MOS transistor region TREG2 taken along a line X2-X2' of FIG. 2. A cross-sectional view taken along the second gate pattern GP2 of the second MOS transistor region TREG2 may be the same and/or similar as that of FIG. 3A. Thus, in the description of FIG. 3C, the description overlapping with FIGS. 3A and 3B will be briefly described or omitted.

Referring to FIG. 3C, the substrate 100 may include a second active pattern AP2 including a second protrusion portion AF2 and a second recess portion RE2. The second protrusion portion AF2 may be a fin type active pattern formed on an upper portion of the second active pattern AP2.

The second gate pattern GP2 may be formed on the second protrusion portion AF2, as illustrated in FIG. 3C. The second gate patterns GP2 may be spaced apart from each other by the first distance S1. The second recess portion RE2 may be a portion recessed from a second upper surface APS2 of the second protrusion portion AF2 of the second active pattern AP2 to a second bottom surface APB2 at a second depth RD2. The second depth RD2 may be greater than the first depth RD1 of FIG. 3B.

A second source/drain region SD2 may be formed on the second recess portion RE2. The second source/drain region SD2 may include a plurality of second base epitaxial layers SD2a, SD2b, and SD2c having different impurity concentrations. In FIG. 3C, three second base epitaxial layers SD2a, SD2b, and SD2c are illustrated. However, this is illustrated for convenience and the present inventive concepts are not limited thereto.

The second source/drain regions SD2 may be formed with a second reinforcing epitaxial layer SD2r on the second base epitaxial layers SD2a, SD2b, and SD2c. The second reinforcing epitaxial layer SD2r may be formed on a second epitaxial recess portion ERE2 formed by recessing upper surfaces of the second base epitaxial layers SD2a, SD2b, and/or SD2c.

The second reinforcing epitaxial layer SD2r may be formed to have an upper surface slightly higher than the second upper surface APS2 of the second protrusion portion AF2 of the second active pattern AP2 between the second gate patterns GP2. The uppermost surface of the second reinforcing epitaxial layer SD2r may be located higher than the lower surface of the second gate patterns GP2. The lowermost surface of the second reinforcing epitaxial layer SD2r may be positioned lower than the second upper surface APS2 of the second protrusion portion AF2 of the second active pattern AP2. A second contact portion CA2 may be connected to the second reinforcing epitaxial layer SD2r of the second source/drain region SD2.

The second reinforcing epitaxial layer SD2r may be formed in an upper shape thereof, that is, an upper epitaxial growth surface, in a cone shape. The second contact portion CA2 formed on the second source/drain regions SD2 may be reliably formed by widening a surface area of the second source/drain regions SD2 due to the formation of the cone-shaped second epitaxial layer SD2r.

The second base epitaxial layers SD2a, SD2b, and SD2c and the second reinforcing epitaxial layer SD2r may be formed by an epitaxial growth method. The second base epitaxial layers SD2a, SD2b, and SD2c and the second reinforcing epitaxial layer SD2r may be formed of the same material as the first base epitaxial layers SD1a and SD1b and the first reinforcing epitaxial layer SD1r.

FIG. 3D is a cross-sectional view of the third MOS transistor region TREG3 taken along X3-X3' in FIG. 2. A cross-sectional view taken along the third gate pattern GP3 of the third MOS transistor region TREG3 may be the same or similar as that of FIG. 3A. Thus, in the description of FIG. 3D, the description overlapping with FIGS. 3A, 3B, and 3C will be briefly described or omitted.

Referring to FIG. 3D, the substrate 100 may include a third active pattern AP3 including a third protrusion portion AF3 and a third recess portion RE3. The third protrusion portion AF3 may be a fin type active pattern formed on an upper portion of the third active pattern AP3. The third gate pattern GP3 may be formed on the third protrusion portion AF3, as illustrated in FIG. 3D. The third gate patterns GP3 may be spaced apart from each other by a second distance S2 that is greater than the first distance S1. In some embodiments, the second distance S2 may be a distance between closest portions of adjacent ones of the first gate patterns GP3.

The third recess portion RE3 may be a portion recessed from a third upper surface APS3 of the third protrusion portion AF3 of the third active pattern AP3 to a third bottom surface APB3 at a third depth RD3. The third depth RD3 may be greater than the first depth RD1 and the second depth RD2 of FIGS. 3B and 3C, respectively. A third source/drain region SD3 may be formed on the third recess portion RE3. The third source/drain region SD3 may include third base epitaxial layers SD3a, SD3b, and SD3c having different impurity concentrations. Although three third base epitaxial layers SD3a, SD3b, and SD3c are illustrated in FIG. 3D, this is illustrated for convenience and the present inventive concepts are not limited thereto.

The third source/drain regions SD3 may be formed with a third reinforcing epitaxial layer SD3r on the third base epitaxial layers SD3a, SD3b, and SD3c, and the third reinforcing epitaxial layer SD3r may have an epitaxial growth surface that is different than those of the first reinforcing epitaxial layer SD1r and the second reinforcing epitaxial layer SD2r. The third reinforcing epitaxial layer SD3r may be formed on the third epitaxial recess portion ERE3 that may be formed by recessing the upper surfaces of the third base epitaxial layers SD3a, SD3b, and/or SD3c.

The third reinforcing epitaxial layer SD3r may be formed to be higher than the third upper surface APS3 of the third protrusion portion AF3 of the third active pattern AP3 between the third gate patterns GP3. The uppermost surface of the third reinforcing epitaxial layer SD3r may be located higher than the lower surface of the third gate patterns GP3. The lowest surface of the third reinforcing epitaxial layer SD3r may be positioned lower than the third upper surface APS3 of the third protrusion portion AF3 of the third active pattern AP3. A third contact CA3 may be connected to the third reinforcing layer SD3r of the third source/drain regions SD3.

The third reinforcing epitaxial layer SD3r may have an upper shape thereof, that is, an upper epitaxial growth surface, formed in a planar shape. The third contact portion CA3 formed on the third source/drain regions SD3 may be reliably formed due to the formation of the planar third reinforcing epitaxial layer SD3r. The third base epitaxial layers SD3a, SD3b, and SD3c and the third reinforcing epitaxial layer SD3r may be formed by an epitaxial growth method. The third base epitaxial layers SD3a, SD3b, and SD3c and the third reinforcing epitaxial layer SD3r may be formed of the same material as the second base epitaxial layers SD2a, SD2b, and SD2c and the second reinforcing epitaxial layer SD2r.

The integrated circuit semiconductor device 200 according to an embodiment of the present inventive concepts as described above may reliably construct the source/drain regions by providing the first to third reinforcing epitaxial layers SD1r to SD3r in the first to third source and drain regions SD1 to SD3, respectively. Accordingly, the integrated circuit semiconductor device 200 of the present inventive concepts may improve device performance and leakage characteristics.

In addition, the integrated circuit semiconductor device 200 of the present inventive concepts may be reliably manufactured without any limitation of first and second widths S1 and S2 between the first to third gate patterns GP1 to GP3 and first to third recess depths RD1 to RD3. Thus, the first to third source/drain regions SD1 to SD3 may be reliably formed, thereby improving device performance and improving leakage characteristics.

Figure 4A:
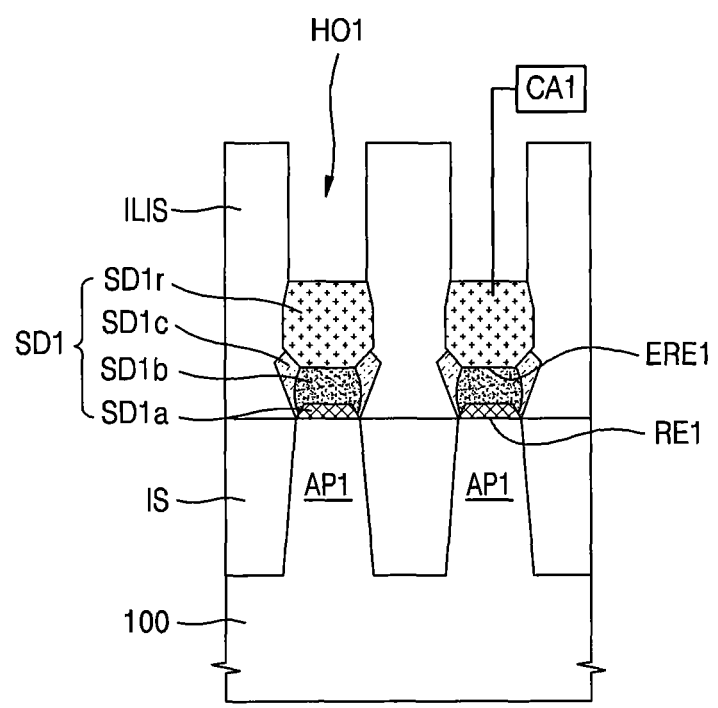
FIG. 4A is a cross-sectional view taken along a line Y2-Y2' of FIG. 2.
Figure 4B:
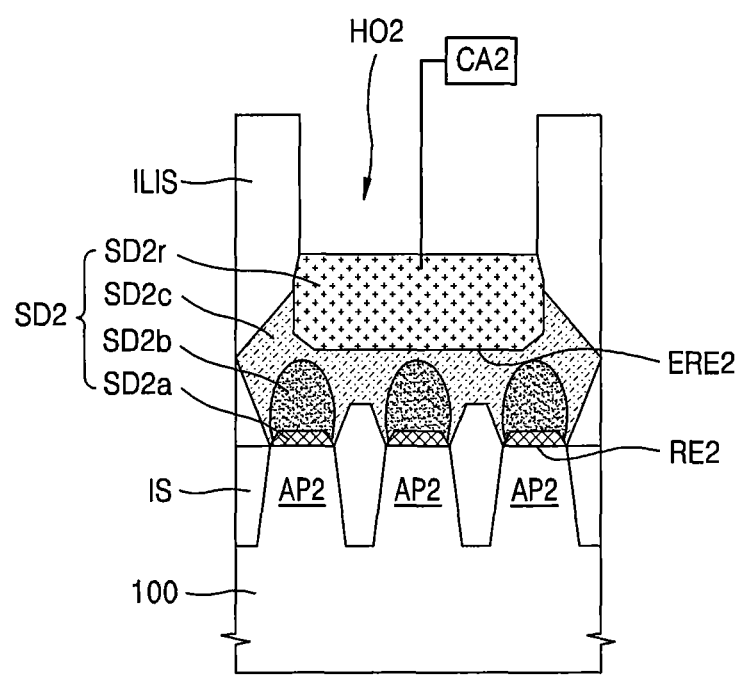
FIG. 4B is a cross-sectional view taken along a line Y3-Y3' of FIG. 2.
Figure 4C:
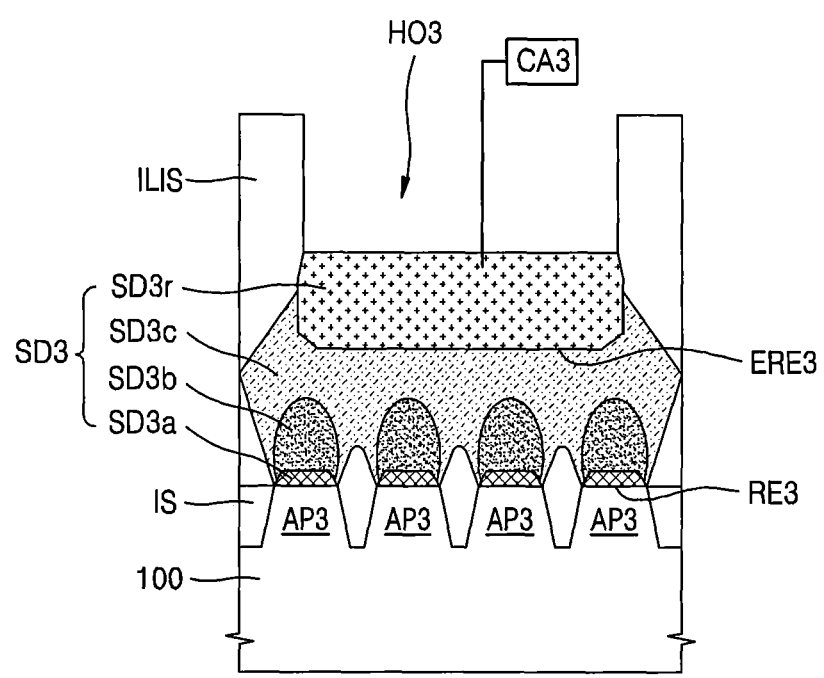
FIG. 4C is a cross-sectional view taken along a line Y4-Y4' of FIG. 2.

FIG. 4A is a cross-sectional view taken along a line Y2-Y2' of FIG. 2, FIG. 4B is a cross-sectional view taken along a line Y3-Y3' of FIG. 2, and FIG. 4C is a cross-sectional view taken along a line Y4-Y4' of FIG. 2.

Specifically, FIG. 4A is be a cross-sectional view of the first MOS transistor region TREG1 according to a line Y2-Y2' in FIG. 2. The substrate 100 may include a first active pattern AP1 including a first recess portion RE1. The first source/drain region SD1 may be formed over the first recess portion RE1. The first source/drain regions SD1 may include a plurality of first base epitaxial layers SD1a, SD1b, and SD1c having different impurity concentrations.

The first source/drain regions SD1 may be formed with a first reinforcing epitaxial layer SD1r on the first base epitaxial layers SD1a, SD1b and SD1c. The first reinforcing epitaxial layer SD1r may be formed on the first epitaxial recess portion ERE1 formed by recessing upper surfaces of the first base epitaxial layers SD1a, SD1b, and SD1c. The first epitaxial recess portion ERE1 may be formed in the process of forming a first contact hole HO1 to expose the first base epitaxial layers SD1a, SD1b, and SD1c by etching an interlayer insulating layer ILIS.

A first contact portion CA1 may be connected to the first reinforcing epitaxial layer SD1r of the first source/drain regions SD1. The first contact portion CA1 may be reliably formed due to the first reinforcing epitaxial layer SD1r.

FIG. 4B is a cross-sectional view of the second MOS transistor region TREG2 taken along to a line Y3-Y3' of FIG. 2. The substrate 100 may include a second active pattern AP2 including a second recess portion RE2. A second source/drain region SD2 may be formed on the second recess portion RE2. The second source/drain regions SD2 may be formed, for example, on three second active patterns AP2. Since the second source/drain regions SD2 are formed on a second recess portion RE2 recessed to the second depth RD2, as illustrated in FIG. 3C, the second source/drain regions SD2 may be formed on the three second active patterns AP2.

The second source/drain regions SD2 may include a plurality of second base epitaxial layers SD2a, SD2b, and SD2c having different impurity concentrations. The second source/drain regions SD2 may be formed with a second reinforcing epitaxial layer SD2r on the second base epitaxial layers SD2a, SD2b, and SD2c. The second reinforcing epitaxial layer SD2r may be formed on a second epitaxial recess portion ERE2 formed by recessing the upper surface of the second base epitaxial layers SD2a, SD2b, and/or SD2c. The second epitaxial recess portion ERE2 may be formed in the process of forming the second contact hole H02 exposing the second base epitaxial layers SD2a, SD2b, and SD2c by etching the interlayer insulating layer ILIS.

The second contact portion CA2 may be connected to the second reinforcing epitaxial layer SD2r of the second source/drain region SD2. The second contact portion CA2 may be reliably formed due to the second reinforcing epitaxial layer SD2r.

FIG. 4C is a cross-sectional view of the third MOS transistor region TREG3 taken along a line Y4-Y4' in FIG. 2. The substrate 100 may include a third active pattern AP3 including a third recess portion RE3. A third source/drain region SD3 may be formed over the third recess portion RE3.

The third source/drain region SD3 may be formed, for example, on four third active patterns AP3. Since the third source/drain regions SD3 are formed on the third recess portion RE3 recessed to the third depth RD3, as illustrated in FIG. 3D, the third source/drain region SD3 may be formed on four third active patterns AP3.

The third source/drain regions SD3 may include a plurality of third base epitaxial layers SD3a, SD3b, and SD3c having different impurity concentrations. The third source/drain regions SD3 may be formed with a third reinforcing epitaxial layer SD3r over the third base epitaxial layers SD3a, SD3b, and SD3c. The third reinforcing epitaxial layer SD3r may be formed on the third epitaxial recess portion ERE3 formed by recessing upper surfaces of the third base epitaxial layers SD3a, SD3b, and SD3c. The third epitaxial recess portion ERE3 may be formed in the process of forming a third contact hole H03 exposing the third base epitaxial layers SD3a, SD3b, and SD3c by etching the interlayer insulating layer ILIS.

The third contact CA3 may be connected to the third reinforcing layer SD3r of the third source/drain regions SD3. The third contact portion CA3 may be reliably formed due to the third reinforcing epitaxial layer SD3r.

FIGS. 5 to 10 are cross-sectional views illustrating a method of manufacturing an integrated circuit semiconductor device, according to an embodiment of the present inventive concepts. FIGS. 5 to 10 are cross-sectional views according to lines Y1-Y1', Y2-Y2', and X1-X1' in FIG. 2.

Figure 5:
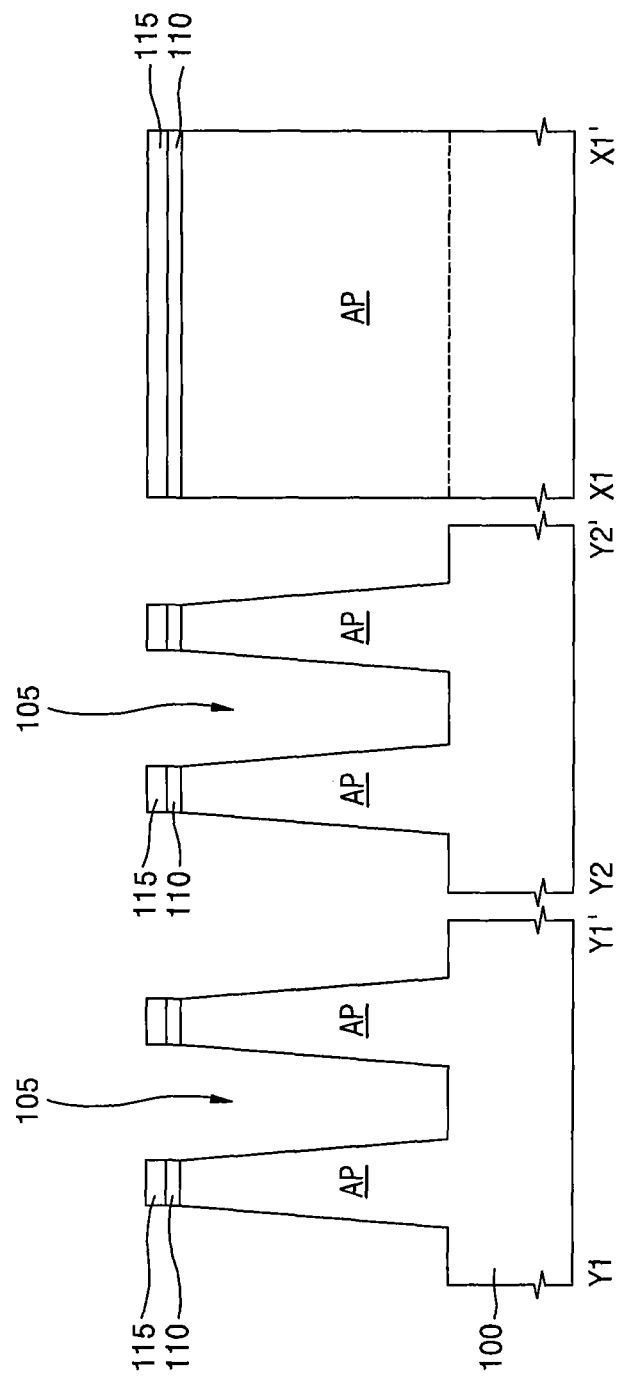
FIGS. 5 to 10 are cross-sectional views illustrating a method of manufacturing an integrated circuit semiconductor device, according to an embodiment of the present inventive concepts.

Referring to FIG. 5, a device isolation trench 105 may be formed by patterning a substrate 100 to define an active pattern AP. The active pattern AP may correspond to the first active pattern AP1 of FIGS. 2, 3A, and 3B. The substrate 100 may be a semiconductor substrate including, for example, silicon, germanium, silicon-germanium, or the like, or may be a compound semiconductor substrate. In some embodiments, the active pattern AP may be doped with a dopant of a first conductivity type.

The device isolation trench 105 may be formed by forming a mask pattern on the substrate 100 and then anisotropically etching the substrate 100 using the mask pattern as an etch mask. According to an embodiment of the present inventive concepts, the mask pattern may include a first mask pattern 110 and a second mask pattern 115 on the first mask pattern 110. The first mask pattern 110 and the second mask pattern 115 may be etch selective with respect to one another. According to one example, the device isolation trenches 105 may be formed to become narrower as a distance from the substrate 100 decreases. Accordingly, each of the active patterns AP may be formed to have a shape becoming narrower toward an upper portion thereof.

Figure 6:
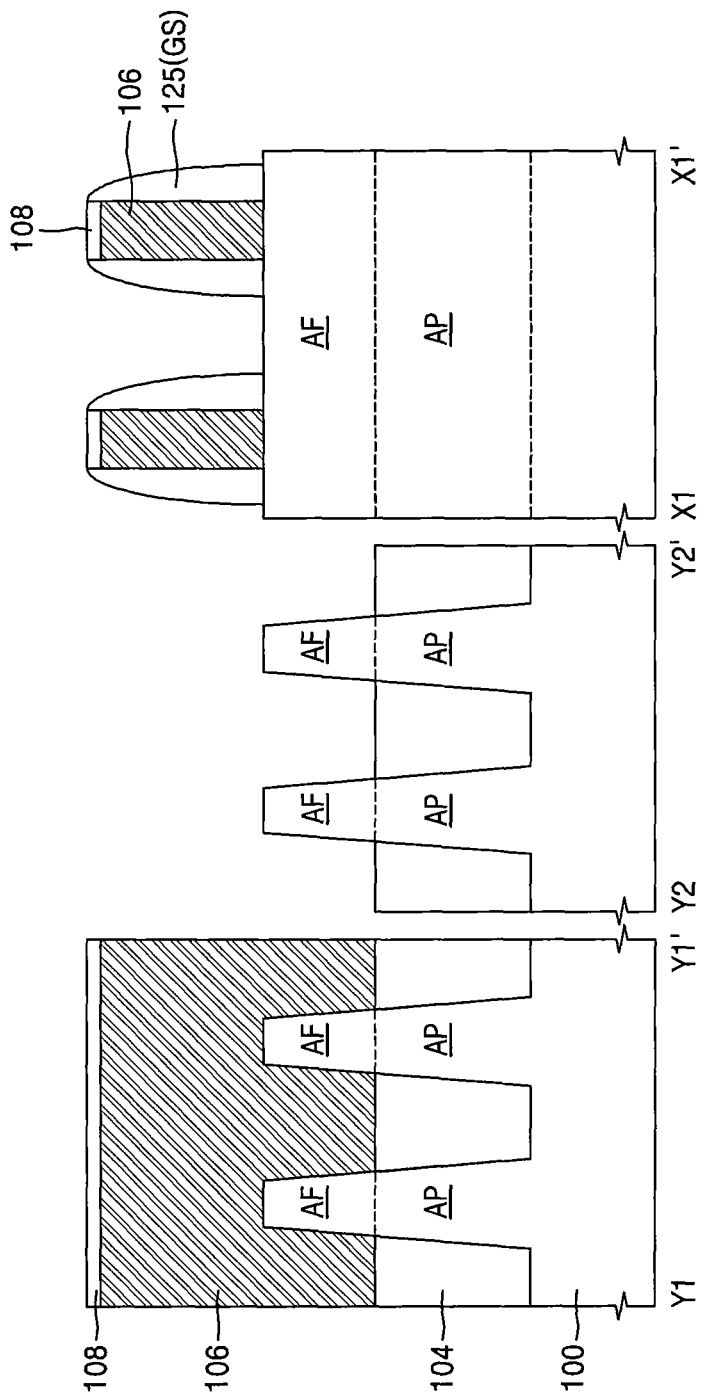

Referring to FIG. 6, a device isolation layer 104 filling the device isolation trenches 105 may be formed. The formation of the device isolation layer 104 may include forming an insulating layer (e.g., a silicon oxide layer) filling the device isolation trenches 105, and then planarizing the insulating layer. Thus, the device isolation layer 104 may be formed locally in the device isolation trench 105.

Subsequently, the protrusion portion AF of the upper region of the active pattern AP may be exposed. The protrusion portion AF may correspond, for example, to the first protrusion portion AF1 of FIGS. 2, 3A, and 3B. The protrusion portion AF may be an active fin. Exposing the protrusion portion AF may include recessing the upper portion of the device isolation layer 104 using wet etching. The etching of the device isolation layer 104 may use an etch recipe having etch selectivity for the active pattern AP. The first mask pattern 110 and the second mask pattern 115 may be removed while the device isolation layer 104 is being etched, and thus upper surfaces of the protrusion portions AF may be exposed.

Next, a sacrificial gate pattern 106 and a gate mask pattern 108 stacked in sequence on the protrusion portion AF may be formed. The sacrificial gate pattern 106 and the gate mask pattern 108 may be formed, for example, in a line shape or a bar shape extending in the second direction (e.g., Y direction in FIG. 2) across the protrusion portion AF. The sacrificial gate pattern 106 may include, for example, a polysilicon layer. The gate mask pattern 108 may include, for example, a silicon nitride layer or a silicon oxynitride layer.

Gate spacers 125 (GS) may be formed on both sidewalls of the sacrificial gate pattern 106. The gate spacers 125 (GS) may be formed by conformably forming a spacer layer on the substrate 100 on which the sacrificial gate pattern 106 is formed and then performing a frontal anisotropic etching process. The gate spacers 125 (GS) may be formed, for example, using at least one of SiO2, SiCN, SiCON, and SiN.

Figure 7:
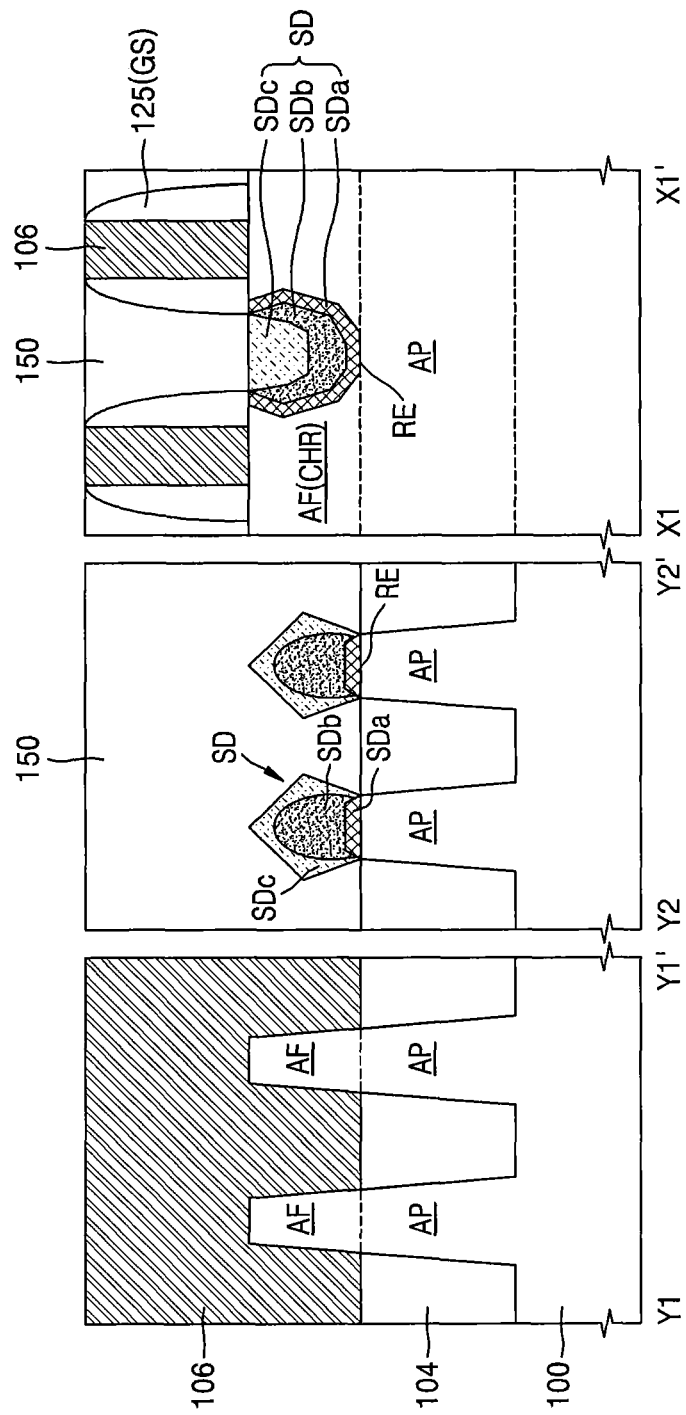

Referring to FIG. 7, a source/drain region SD may be formed on both sides of the sacrificial gate pattern 106. The source/drain region SD may correspond, for example, to the first source/drain regions SD1 of FIGS. 2, 3A, and 3B. The source/drain region SD may include base epitaxial layers SDa, SDb, and SDc.

The source/drain region SD may be formed by a selective epitaxial growth process in which the substrate 100 is a seed layer. The selective epitaxial growth process may include, for example, a chemical vapor deposition (CVD) process or a molecular beam epitaxy (MBE) process.

Specifically, the recess portion RE may be formed by selectively etching the projecting portion AF using the gate mask pattern 108 and the gate spacers 125 (GS) as an etching mask. The source/drain regions SD may be formed when the upper portion of the exposed active pattern AP is epitaxially grown into the seed layer after the protrusion portion AF is etched. As the source/drain regions SD are formed, channel regions CHR may be defined between the source/drain regions SD.

The upper surface of the source/drain regions SD may be the same as or higher than the upper surfaces of the channel region CHR. The upper surface of the source/drain regions SD may have a non-zero curvature. For example, in some embodiments, the source/drain regions SD may have convex upper surfaces. In some embodiments, the source/drain regions SD may have peaked upper surfaces. In some embodiments, the source/drain regions SD may be conical (or cone-shaped) and/or have conical upper surfaces.

The source/drain regions SD may include a semiconductor device different from the substrate 100. The source/drain regions SD may be doped with a dopant of a second conductivity type different from the first conductivity type of the protruding patterns AP. For example, the dopant of the second conductivity type may be doped in-situ during the formation of the source/drain regions SD.

A first interlayer insulating layer 150 on and, in some embodiments, covering the source/drain regions SD may be formed. The first interlayer insulating layer 150 may be formed by forming an insulating layer covering the sacrificial gate pattern 106 and the gate mask pattern 108 over the entire surface of the substrate 100. For example, the first interlayer insulating layer 150 may include a silicon oxide layer and may be formed by a flowable chemical vapor deposition (FCVD) process.

Subsequently, the first interlayer insulating layer 150 may be planarized until the upper surfaces of the sacrificial gate patterns 106 are exposed. The planarization of the first interlayer insulating layer 150 may be performed, for example, using an etch back process or a chemical mechanical polishing (CMP) process. The planarization process may remove the gate mask pattern 108, thus exposing the upper surfaces of the sacrificial gate pattern 106.

Figure 8:
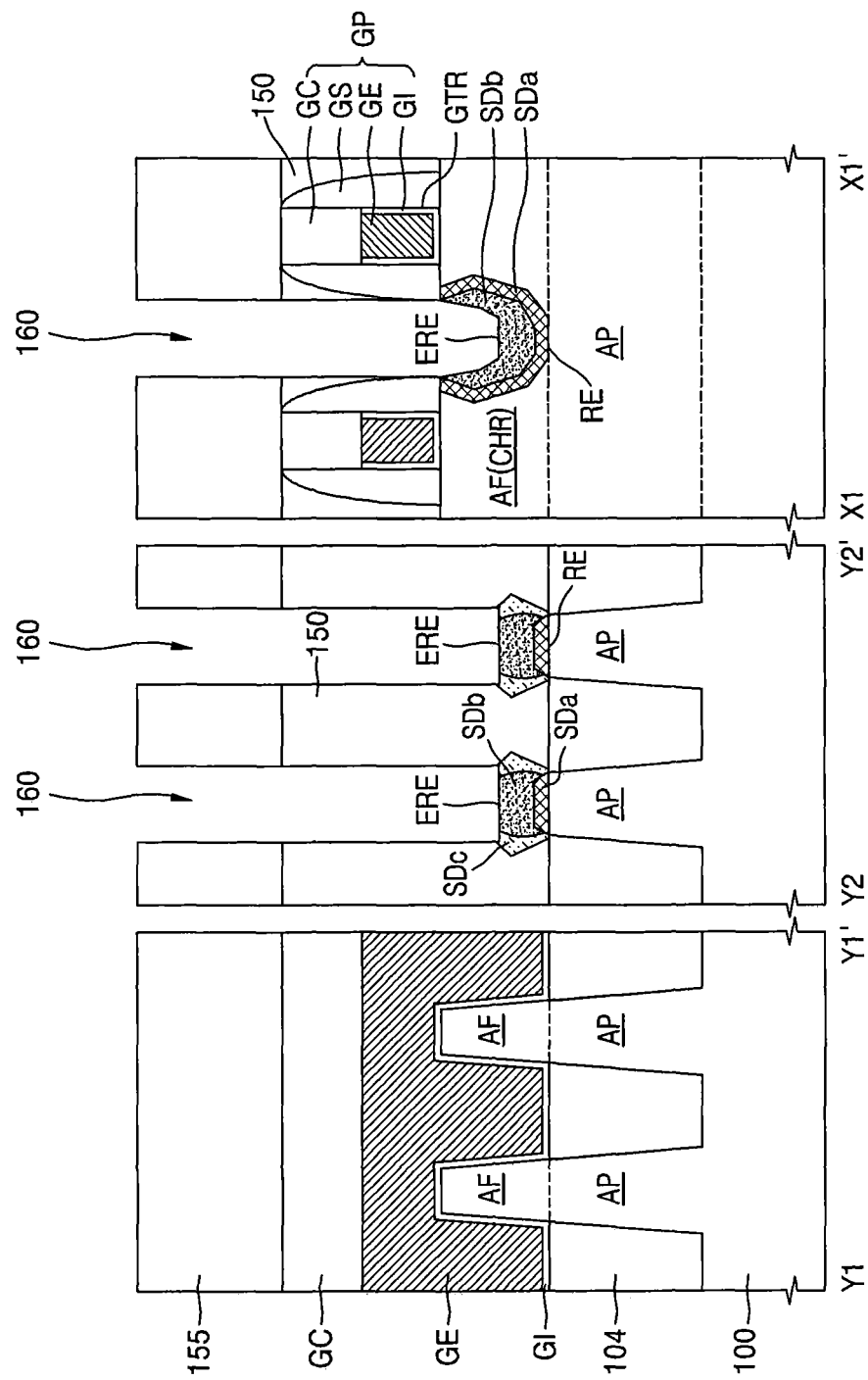

Referring to FIG. 8, the sacrificial gate pattern 106 may be replaced with a gate pattern GP. The gate pattern GP may include a gate insulating layer GI, a gate electrode GE, and a gate capping layer GC.

Specifically, the sacrificial gate pattern 106 may be removed to form a gate trench GTR. The gate trench GTR may be formed by an etch process selectively removing the sacrificial gate pattern 106. A channel region CHR on a protrusion portion AF may be exposed by the gate trench GTR. The gate insulating layer GI, the gate electrode GE, and the gate capping layer GC may be formed in each gate trench GTR. In some embodiments, the gate insulating layer GI and the gate electrode GE may be formed so as not to completely fill the gate trench GTR.

The gate insulating layer GI may be formed, for example, by an atomic layer deposition (ALD) process or an oxidation process. For example, a gate insulating layer GI may include a high-k material. The high-k material may include, for example, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminium oxide, lead scandium tantalum oxide, and/or lead zinc niobate.

The gate electrode GE may include, for example, at least one of a conductive metal nitride (e.g., titanium nitride or tantalum nitride) and/or a metal material (e.g., titanium, tantalum, tungsten, copper or aluminium). The gate electrode GE may be formed by a deposition process selected from a CVD or sputtering process.

The gate capping layer GC may include, for example, at least one of SiON, SiCN, SiCON, and/or SiN. The gate capping layer GC may be formed by atomic layer deposition (ALD), plasma enhanced chemical vapor deposition (PECVD), or high density plasma chemical vapor deposition (HDPCVD).

Subsequently, a second interlayer insulating layer 155 may be formed on the first interlayer insulating layer 150 and the gate capping layer GC. The second interlayer insulating layer 155 may include a silicon oxide layer. In some embodiments, the second interlayer insulating layer 155 may include a silicon oxide layer doped with carbon, e.g., SiCOH. The second interlayer insulating layer 155 may be formed by a CVD process.

A contact hole 160 may be formed through the second interlayer insulating layer 155 and the first interlayer insulating layer 150 exposing the source/drain region SD. For example, the contact hole 160 may be a self-aligned contact hole being self-aligned by a gate capping layer GC and a gate spacer GS. An upper portion of the source/drain region SD may be partially etched when the contact hole 160 is formed. As a result, an epitaxial recess portion ERE may be formed at the upper portion of the source/drain region SD. In some embodiments, the formation of the contact hole 160 may result in portions of one of the base epitaxial layers being removed (e.g., SDc) between gate patterns GP.

Figure 9:
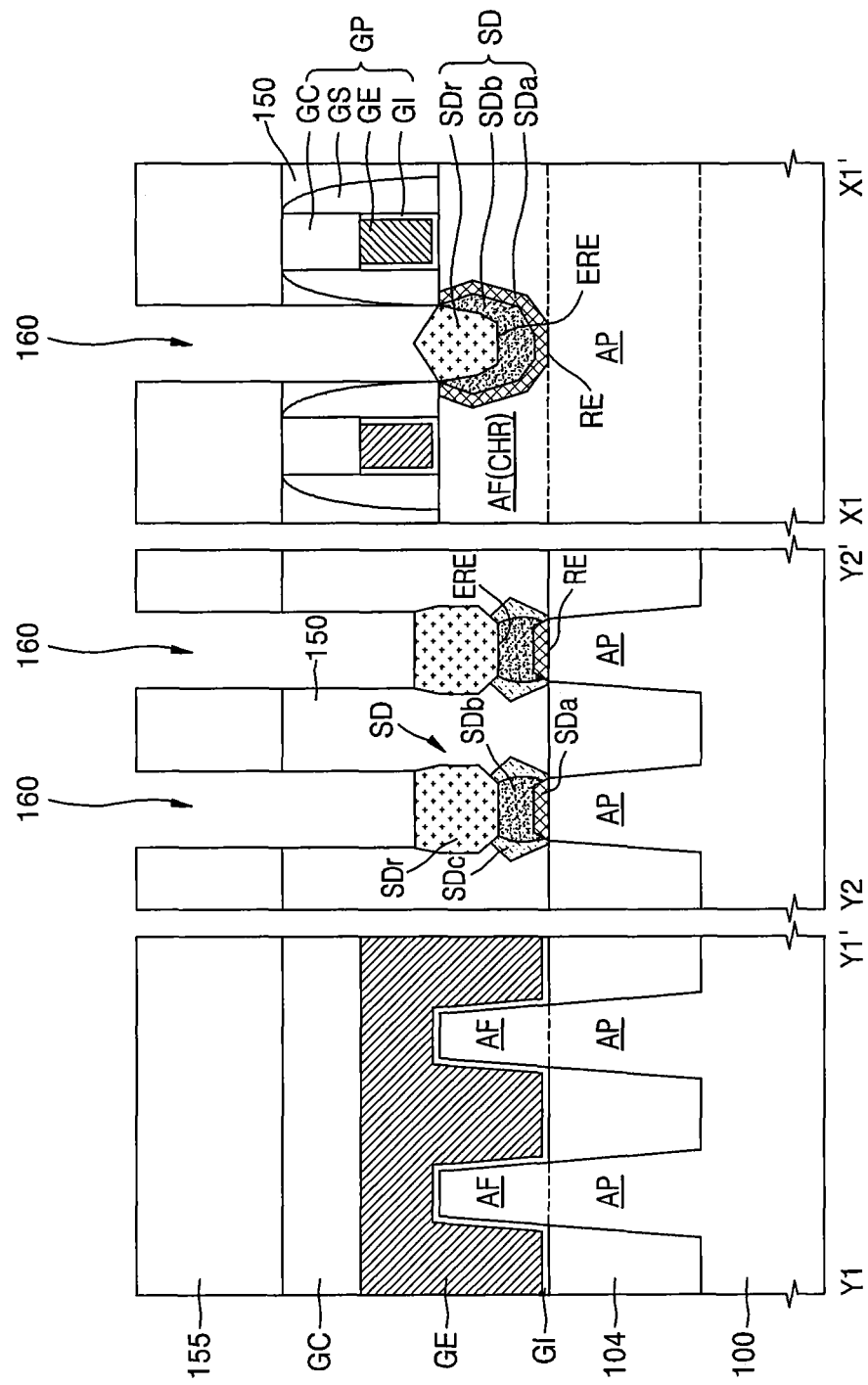

Referring to FIG. 9, a reinforcing epitaxial layer SDr may be formed on the epitaxial recess portion ERE as illustrated in FIG. 9. The reinforcing epitaxial layer SDr may be a material layer for reinforcing the source/drain region SD. The reinforcing epitaxial layer SDr may correspond, for example, to the first reinforcing epitaxial layer SD1r in FIG. 3B. In some embodiments, the formation of the reinforcing epitaxial layer SDr between the gate patterns GP may result in the upper surface of the reinforcing epitaxial layer SDr having a conical shape.

Figure 10:
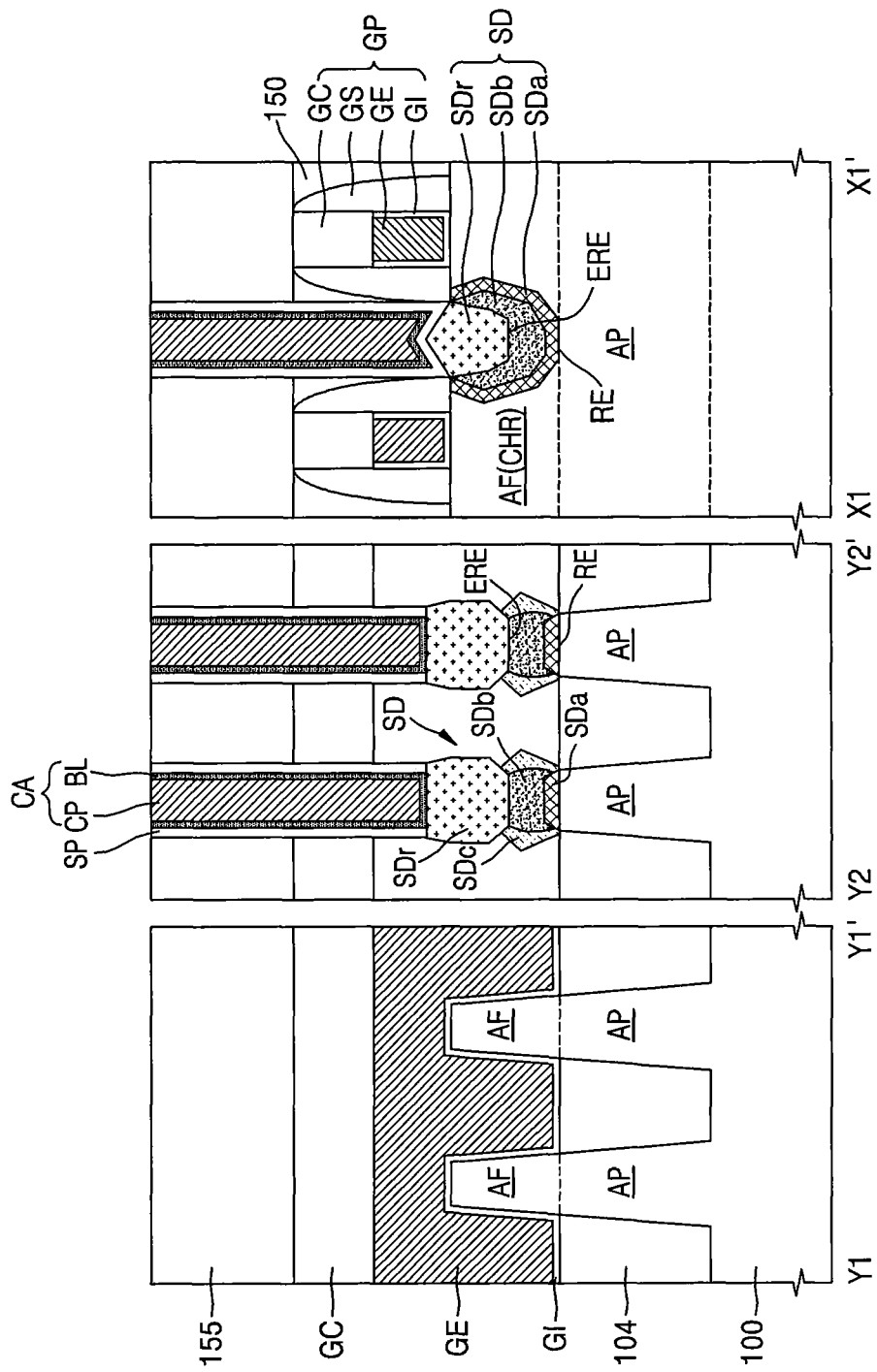

Referring to FIG. 10, a spacer SP and a contact portion CA may be formed on the reinforcing epitaxial layer SDr in the contact hole 160. The spacer SP may be formed on an inner wall of the contact hole 160. The spacer SP may include, for example, at least one of SiO2, SiCN, SiCON, and/or SiN.

Afterwards, the contact portion CA may be formed to be within and, in some embodiments, fill the contact hole 160 on an upper portion of the reinforcing epitaxial layer SDr in the contact hole 160 and the spacer SP. The contact portion CA may correspond to the first contact portion CA1 of FIG. 3B. The contact portion CA may include a conductive pillar CP and a barrier layer BL surrounding the conductive pillar CP. The barrier film BL may include, for example, a metal nitride, (e.g., Ti/TiN), and the conductive pillars CP may include, for example, a metal material (e.g., tungsten).

Figure 11:
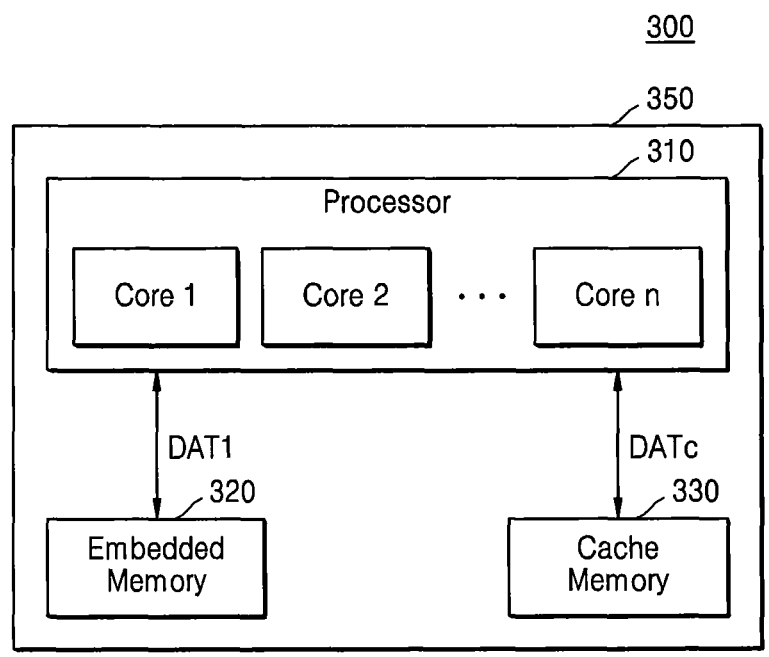
FIG. 11 is a block diagram showing the configuration of an electronic device including an integrated circuit having a semiconductor device according to some embodiments of the present inventive concepts.

FIG. 11 is a block diagram showing the configuration of an electronic device 300 including an integrated circuit having a semiconductor device according to some embodiment of the present inventive concepts.

Specifically, an electronic device 300 may include a semiconductor chip 350. The semiconductor chip 350 may include a processor 310, an embedded memory 320, and a cache memory 330.

The processor 310 may include one or more processor cores Core 1 to Core n. The one or more processor cores Core 1 to Core n may process data and/or signals. The processor cores Core 1-Core n may include an integrated circuit semiconductor device 200 according to an embodiment of the present inventive concepts and may include a plurality of logic cells as described with reference to FIG. 1.

The electronic device 300 may perform its functions using the processed data and/or signals. For example, the processor 310 may be an application processor. The embedded memory 320 may exchange first data DAT1 with the processor 310. The first data DAT1 may be data to be processed or processed by the one or more processor cores Core 1 to Core n. The embedded memory 320 may manage the first data DAT1. For example, the embedded memory 320 may buffer the first data DAT1. The embedded memory 320 may operate as a buffer memory and/or a working memory of the processor 310.

According to some embodiments of the inventive concepts, the electronic device 300 may be applied to a wearable electronic device. A wearable electronic device may perform more functions requiring a relatively smaller amount of computation than other types of devices. When the electronic device 300 is applied to a wearable electronic device, the embedded memory 320 may not have a large buffer capacity.

The embedded memory 320 may be static random access memory (SRAM). The SRAM may operate faster than DRAM. When the SRAM is embedded in the semiconductor chip 350, the electronic device 300 having a small size and operating at a high speed may be implemented. Furthermore, when the SRAM is embedded in the semiconductor chip 350, the consumption of the active power of the electronic device 300 may be reduced. In an embodiment, the SRAM may include an integrated circuit semiconductor device 200 according to embodiments of the present inventive concepts.

The cache memory 330 may be mounted with the semiconductor chip 350 together with one or more processor cores Core 1 to Core n. The cache memory 330 may store cache data DATc. The cache data DATc may be data used by one or more processor cores Core 1 through Core n. The cache memory 330 may have a small storage capacity, but may operate at a very high speed. In some embodiments, the cache memory 330 may include an integrated circuit semiconductor device 200 according to some embodiments of the present inventive concepts. The cache memory 330 may include SRAM. When the cache memory 330 is provided, the number and time that the processor 310 accesses the embedded memory 320 may be reduced. Accordingly, when the cache memory 330 is provided, the operation speed of the electronic device 300 may be increased.

In FIG. 11, the cache memory 330 is illustrated as a component separated from the processor 310. However, the cache memory 330 may be configured to be included in the processor 310. The processor 310, the embedded memory 320, and/or the cache memory 330 may transfer data based on various interface protocols. For example, the processor 310, the embedded memory 320, and/or the cache memory 330 may transfer data based on one or more of interface protocols based on a universal serial bus (USB), a small computer system interface (SCSI), a peripheral component interconnect (PCI) express, an advanced technology attachment (ATA), a parallel ATA (PATA), a serial ATA (SATA), a serial attached SCSI (SAS), an integrated drive electronics (IDE), a universal flash storage (UFS), and the like.

Figure 12:
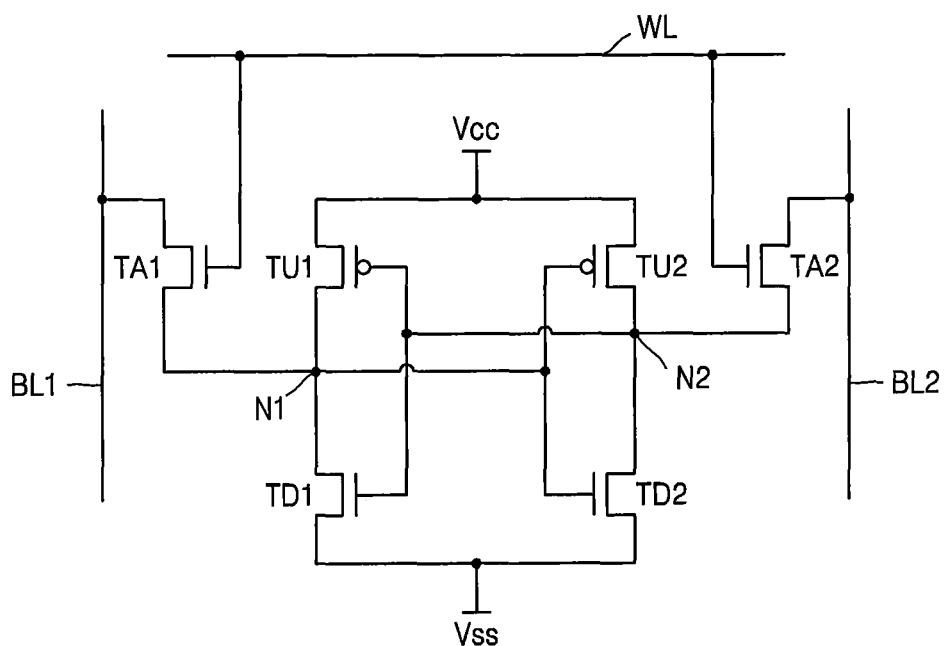
FIG. 12 is an equivalent circuit diagram of a static random access memory (SRAM) cell using an integrated circuit semiconductor device according to some embodiments of the present inventive concepts.

FIG. 12 is an equivalent circuit diagram of an SRAM cell using an integrated circuit semiconductor device according to some embodiments of the present inventive concepts.

Specifically, the SRAM cell of FIG. 12 may be implemented using the integrated circuit semiconductor device 200 of the present inventive concepts. In an embodiment of the present inventive concepts, the SRAM cell may be applied to the embedded memory 320 and/or the cache memory 330 described in FIG. 11.

The SRAM cell may include a first pull-up transistor TU1, a first pull-down transistor TD1, a second pull-up transistor TU2, a second pull-down transistor TD2, a first access transistor TA1, and a second access transistor TA2.

The first and second pull-up transistors TU1 and TU2 may be PMOS transistors, while the first and second pull-down transistors TD1 and TD2 and the first and second access transistors TA1 and TA2 may be NMOS transistors.

A first source/drain of the first pull-up transistor TU1 and a first source/drain (or first source/drain region) of the first pull-down transistor TD1 may be connected to a first node N1. The second source/drain (or the second source/drain region) of the first pull-up transistor TU1 may be connected to the power supply line Vcc and the second source/drain of the first pull-down transistor TD1 may be connected to the ground line Vss.

The gate of the first pull-up transistor TU1 and the gate of the first pull-down transistor TD1 may be electrically connected to each other. Accordingly, the first pull-up transistor TU1 and the first pull-down transistor TD1 may constitute a first inverter. The mutually coupled gates of the first pull-up and first pull-down transistors TU1 and TD1 may correspond to the input of the first inverter, and the first node N1 may correspond to the output of the first inverter.

The first source/drain of the second pull-up transistor TU2 and the first source/drain of the second pull-down transistor TD2 may be connected to the second node N2. The second source/drain of the second pull-up transistor TU2 may be coupled to the power supply line Vcc, and the second source/drain of the second pull-down transistor TD2 may be coupled to the ground line Vss.

The gate of the second pull-up transistor TU2 and the gate of the second pull-down transistor TD2 may be electrically connected to each other. Accordingly, the second pull-up transistor TU2 and the second pull-down transistor TD2 may constitute the second inverter. The mutually coupled gates of the second pull-up and second pull-down transistors TU2 and TD2 may correspond to the input of the second inverter, and the second node N2 may correspond to the output of the second inverter.

The first and second inverters may be combined to constitute a latch structure. That is, the gates of the first pull-up and first pull-down transistors TU1 and TD1 may be electrically connected to the second node N2 and the gates of the second pull-up and second pull-down transistors TU2 and TD2 may be electrically connected to the first node N1.

A first source/drain of the first access transistor TA1 may be coupled to the first node N1 and a second source/drain of the first access transistor TA1 may be coupled to a first bit line BL1. The first source/drain region of the second access transistor TA2 may be coupled to the second node N2 and the second source/drain of the second access transistor TA2 may be coupled to a second bit line BL2. The gates of the first and second access transistors TA1 and TA2 may be electrically connected to a word line WL. Thus, an SRAM cell according to the integrated circuit semiconductor devices of the present inventive concepts may be realized.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present inventive concepts have been particularly shown and described with reference to example embodiments thereof, it will be understood by those skilled in the art that various modifications, permutations, and other equivalent embodiments are possible. It may be understood that the above-described embodiments are illustrative and non-restrictive in all respects. The technical protection scope of the present inventive concepts will be defined by the technical spirit of the appended claims.

What is claimed is:

1. An integrated circuit semiconductor device comprising:
a first region extending in a first direction and having a first active pattern with first protrusion portions and first recess portions;
a second region extending in the first direction and having a second active pattern with second protrusion portions and second recess portions;
first gate patterns extending in a second direction crossing the first direction in the first region, wherein the first gate patterns are on respective ones of the first protrusion portions and are spaced apart from each other;
second gate patterns extending in the second direction in the second region, wherein the second gate patterns are on respective ones of the second protrusion portions and are spaced apart from each other;
a first source/drain region on a first recess portion of the first recess portions of the first active pattern, wherein the first source/drain region is between two of the first gate patterns in the first region and comprises a first reinforcing epitaxial layer at an upper portion of the first source/drain region; and
a second source/drain region on a second recess portion of the second recess portions of the second active pattern, wherein the second source/drain region is between two of the second gate patterns in the second region and comprises a second reinforcing epitaxial layer having a second epitaxial growth surface that is shaped differently than a first epitaxial growth surface of the first reinforcing epitaxial layer,
wherein the first and second source/drain regions comprise a plurality of base epitaxial layers, and
wherein at least one first base epitaxial layer of the plurality of base epitaxial layers has a different impurity concentration than a second base epitaxial layer of the plurality of base epitaxial layers.

2. The integrated circuit semiconductor device of claim 1, wherein closest portions of adjacent ones of the first gate patterns in the first region are spaced apart from each other by a first distance in the first direction,
wherein closest portions of adjacent ones of the second gate patterns in the second region are spaced apart from each other by a second distance in the first direction, and
wherein the first distance is less than the second distance.

3. The integrated circuit semiconductor device of claim 1, wherein uppermost surfaces of the first reinforcing epitaxial layer and the second reinforcing epitaxial layer are located higher than lower surfaces of the first gate patterns and the second gate patterns, respectively.

4. The integrated circuit semiconductor device of claim 1, wherein lowermost surfaces of the first reinforcing epitaxial layer and the second reinforcing epitaxial layer are positioned lower than upper surfaces of the first and second protrusion portions of the first and second active patterns, respectively.

5. The integrated circuit semiconductor device of claim 1, wherein the first epitaxial growth surface comprises a peaked shape.

6. The integrated circuit semiconductor device of claim 1, wherein the second epitaxial growth surface comprises a planar shape.

7. The integrated circuit semiconductor device of claim 1, wherein the first and second reinforcing epitaxial layers are on an epitaxial recess portion on a recessed upper surface of the base epitaxial layers.

8. The integrated circuit semiconductor device of claim 1, wherein a first contact portion is connected to the first reinforcing epitaxial layer of the first source/drain region, and
wherein a second contact portion is connected to the second reinforcing epitaxial layer of the second source/drain region.

9. An integrated circuit semiconductor device comprising:
a substrate comprising a first active pattern extending in a first direction and having first protrusion portions and first recess portions of a first depth, and a second active pattern extending in the first direction and having second protrusion portions and second recess portions of a second depth, wherein the second depth is greater than the first depth;
first gate patterns extending in a second direction crossing the first direction and on respective ones of the first protrusion portions, wherein closest portions of adjacent ones of the first gate patterns are spaced apart from each other by a first distance;
second gate patterns extending in the second direction and on respective ones of the second protrusion portions, wherein closest portions of adjacent ones of the second gate patterns are spaced from each other by a second distance equal to the first distance;
a first source/drain region on a first recess portion of the first recess portions of the first active pattern between two of the first gate patterns, wherein the first source/drain region comprises a first reinforcing epitaxial layer at an upper portion thereof; and
a second source/drain region on a second recess portion of the second recess portions of the second active pattern between two of the second gate patterns, wherein the second source/drain region comprises a second reinforcing epitaxial layer at the upper portion thereof.

10. The integrated circuit semiconductor device of claim 9, wherein the first active pattern comprises the first protrusion portions and the first recess portions repeatedly formed in the first direction, and
wherein the second active pattern comprises the second protrusion portions and the second recess portions repeatedly formed in the first direction.

11. The integrated circuit semiconductor device of claim 9, wherein a first contact portion is connected to the first reinforcing epitaxial layer of the first source/drain region, and
wherein a second contact portion is connected to the second reinforcing epitaxial layer of the second source/drain region.

12. The integrated circuit semiconductor device of claim 9, wherein uppermost surfaces of the first and second reinforcing epitaxial layers are higher than lower surfaces of the first gate patterns and the second gate patterns, respectively.

13. The integrated circuit semiconductor device of claim 9, wherein lowermost surfaces of the first reinforcing epitaxial layer and the second reinforcing epitaxial layer are located below upper surfaces of the first and second protrusion portions of the first active pattern and the second active pattern, respectively.

14. The integrated circuit semiconductor device of claim 9, wherein the first reinforcing epitaxial layer and the second reinforcing epitaxial layer comprise an upper epitaxial growth surface in a peaked shape.

15. The integrated circuit semiconductor device of claim 9, wherein the first source/drain region comprises first base epitaxial layers, at least one of the first base epitaxial layers having a different impurity concentration than another one of the first base epitaxial layers,
wherein the first reinforcing epitaxial layer is on a first epitaxial recess portion of the first base epitaxial layers,
wherein the second source/drain region comprises second base epitaxial layers, at least one of the second base epitaxial layers having a different impurity concentration than another one of the first base epitaxial layers, and
wherein the second reinforcing epitaxial layer is on a second epitaxial recess portion of the second base epitaxial layers.

16. An integrated circuit semiconductor device comprising:
a substrate comprising a first active pattern extending in a first direction and having first protrusion portions and first recess portions, and a second active pattern extending in the first direction and having second protrusion portions and second recess portions;
first gate patterns extending in a second direction crossing the first direction and on respective ones of the first protrusion portions;
second gate patterns extending in the second direction and on respective ones of the second protrusion portions;
a first source/drain region on a first recess portion of the first recess portions of the first active pattern between two of the first gate patterns, wherein the first source/drain region comprises a first reinforcing epitaxial layer at an upper portion thereof; and
a second source/drain region on a second recess portion of the second recess portions of the second active pattern between two of the second gate patterns, wherein the second source/drain region comprises a second reinforcing epitaxial layer at an upper portion thereof,
wherein the first reinforcing epitaxial layer has a first upper epitaxial growth surface in a peaked shape, and
wherein the second reinforcing epitaxial layer has a second upper epitaxial growth surface in a planar shape.

17. The integrated circuit semiconductor device of claim 16, wherein a first contact portion is connected to the first reinforcing epitaxial layer of the first source/drain region, and
wherein a second contact portion is connected to the second reinforcing epitaxial layer of the second source/drain region.

18. The integrated circuit semiconductor device of claim 16, wherein the first recess portion has a first depth from an upper surface of an adjacent first protrusion portion of the first protrusion portions,
wherein the second recess portion has a second depth from an upper surface of an adjacent second protrusion portion of the second protrusion portions, and
wherein the second depth is greater than the first depth.

19. The integrated circuit semiconductor device of claim 16, wherein closest portions of adjacent ones of the first gate patterns are spaced apart from each other by a first distance, and
wherein closest portions of adjacent ones of the second gate patterns are spaced apart from each other by a second distance greater than the first distance.

20. The integrated circuit semiconductor device of claim 16, wherein at least one of the first source/drain region and the second source/drain region comprises a first base epitaxial layer on a second base epitaxial layer, the first base epitaxial layer having a first impurity concentration and the second base epitaxial layer having a second impurity concentration, and
wherein the first impurity concentration is different than the second impurity concentration.

* * * * *